US011161999B2

(12) United States Patent
Sasao et al.

(10) Patent No.: US 11,161,999 B2
(45) Date of Patent: Nov. 2, 2021

(54) PATTERN FORMATION METHOD, BLOCK COPOLYMER, AND PATTERN FORMATION MATERIAL

(71) Applicant: Toshiba Memory Corporation, Tokyo (JP)

(72) Inventors: Norikatsu Sasao, Kanagawa (JP); Koji Asakawa, Kanagawa (JP); Tomoaki Sawabe, Tokyo (JP); Shinobu Sugimura, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 17/082,259

(22) Filed: Oct. 28, 2020

(65) Prior Publication Data

US 2021/0040345 A1   Feb. 11, 2021

Related U.S. Application Data

(62) Division of application No. 16/047,419, filed on Jul. 27, 2018, now abandoned.

(30) Foreign Application Priority Data

Dec. 6, 2017   (JP) .............................. JP2017-234631

(51) Int. Cl.
*C09D 153/00* (2006.01)
*C08F 20/28* (2006.01)
(Continued)

(52) U.S. Cl.
CPC ............. *C09D 153/00* (2013.01); *B05D 5/00* (2013.01); *C08F 12/08* (2013.01); *C08F 20/28* (2013.01);
(Continued)

(58) Field of Classification Search
CPC ........ C08F 12/08; C08F 20/28; C09D 125/06; C09D 133/14; C09D 153/00; G03F 7/0002
See application file for complete search history.

(56) References Cited

U.S. PATENT DOCUMENTS 6,639,029 B1   10/2003   Scherer et al.
9,487,600 B2   11/2016   Darling et al.
(Continued)

FOREIGN PATENT DOCUMENTS

JP   5263793 B2      8/2013
JP   2015-082011 A   4/2015
(Continued)

OTHER PUBLICATIONS

Biswas et al., "New Insight into the Mechanism of Sequential Infiltration Synthesis from Infrared Spectroscopy," Chemistry of Materials (2014), pp. 6135-6141.

*Primary Examiner* — James M Mellott
(74) *Attorney, Agent, or Firm* — Finnegan, Henderson, Farabow, Garrett & Dunner L.L.P.

(57) ABSTRACT

According to one embodiment, a pattern formation method is disclosed. The method includes a preparation process, a block copolymer layer formation process, and a contact process. The preparation process includes preparing a pattern formation material including a block copolymer including a first block and a second block. The first block includes a first main chain and a plurality of first side chains. At least one of the first side chains includes a plurality of carbonyl groups. The block copolymer layer formation process includes forming a block copolymer layer on a first member. The block copolymer layer includes the pattern formation material and includes a first region and a second region. The first region includes the first block. The second region includes the second block. The contact process includes (Continued)

causing the block copolymer layer to contact a metal compound including a metallic element.

14 Claims, 3 Drawing Sheets

(51) Int. Cl.
    *C09D 125/06*     (2006.01)
    *C09D 133/14*     (2006.01)
    *C08F 12/08*     (2006.01)
    *G03F 7/00*     (2006.01)
    *B05D 5/00*     (2006.01)

(52) U.S. Cl.
    CPC ......... *C09D 125/06* (2013.01); *C09D 133/14* (2013.01); *G03F 7/0002* (2013.01)

(56) References Cited

U.S. PATENT DOCUMENTS

| | | | |
|---|---|---|---|
| 2010/0102415 A1* | 4/2010 | Millward | ........... C09D 153/005 257/506 |
| 2013/0078576 A1 | 3/2013 | Wu et al. | |
| 2016/0244557 A1 | 8/2016 | Vora et al. | |
| 2019/0211130 A1* | 7/2019 | Morita | ................. C08F 293/00 |

FOREIGN PATENT DOCUMENTS

| | | |
|---|---|---|
| JP | 6077547 B2 | 1/2017 |
| WO | WO 2016/043005 A1 | 3/2016 |
| WO | WO 2017/199521 A1 | 11/2017 |

* cited by examiner

PATTERN FORMATION METHOD, BLOCK COPOLYMER, AND PATTERN FORMATION MATERIAL

CROSS-REFERENCE TO RELATED APPLICATIONS

This application is a divisional application of U.S. application Ser. No. 16/047,419, filed Jul. 27, 2018, which is based upon and claims the benefit of priority from Japanese Patent Application No. 2017-234631, filed on Dec. 6, 2017; the entire contents of each of which are incorporated herein by reference.

FIELD

Embodiments described herein relate generally to a pattern formation method, a block copolymer, and a pattern formation material.

BACKGROUND

For example, there is a method for forming a pattern by directed self-assembly (DSA) of a block copolymer, etc. It is desirable to increase the pattern precision of the pattern formation method and the pattern formation material.

DETAILED DESCRIPTION

Figure 1:
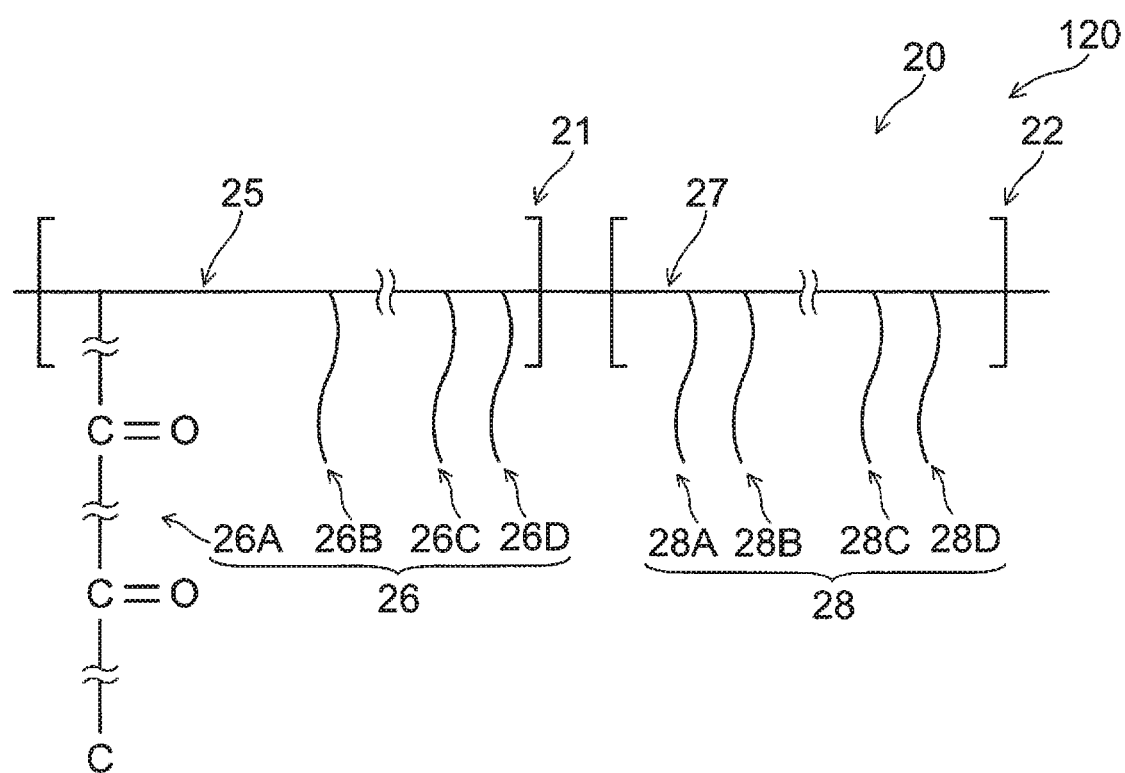
FIG. 1 is a schematic view illustrating a pattern formation material used in a pattern formation method according to a first embodiment.

According to one embodiment, a pattern formation method is disclosed. The method includes a preparation process, a block copolymer layer formation process, and a contact process. The preparation process includes preparing a pattern formation material including a block copolymer including a first block and a second block. The first block includes a first main chain and a plurality of first side chains. At least one of the first side chains includes a plurality of carbonyl groups. The block copolymer layer formation process includes forming a block copolymer layer on a first member. The block copolymer layer includes the pattern formation material and includes a first region and a second region. The first region includes the first block. The second region includes the second block. The contact process includes causing the block copolymer layer to contact a metal compound including a metallic element.

According to another embodiment, a block copolymer includes a first block, and a second block. The first block includes a first main chain and a plurality of first side chains. At least one of the first side chains includes a plurality of carbonyl groups. A number of carbon atoms included in the at least one of the first side chains is not less than 3 but less than 7. A number of oxygen atoms included in the at least one of the first side chains is not less than 2 but less than 5. A terminal of the at least one of the first side chains is a hydrocarbon.

According to another embodiment, a pattern formation material includes the block copolymer described above, and a solvent.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic view illustrating a pattern formation material used in a pattern formation method according to a first embodiment.

As shown in FIG. 1, the pattern formation material 120 includes a block copolymer 20. The pattern formation material 120 may further include a solvent. Examples of the solvent are described below.

The block copolymer 20 includes a first block 21 and a second block 22. In the example, the block copolymer 20 is a diblock copolymer. The number of types of blocks included in the block copolymer 20 may be three or more. The first block 21 is different from the second block 22. The first block 21 includes, for example, a carbonyl group. On the other hand, in one example, the second block 22 does not include, for example, a carbonyl group.

The first block 21 includes a first main chain 25 and multiple first side chains 26 (side chains 26A, 26B, 26C, 26D, etc.). In the first block 21, at least one of the multiple first side chains 26 (e.g., the side chain 26A) includes multiple carbonyl groups.

The first block 21 includes, for example, at least one of PAcAA (polyacetonyl acrylate) or PAcMA (polyacetonyl methacrylate).

For example, the density of the carbonyl group with respect to the molecular weight is high for PAcAA and PAcMA. In the case where PAcAA or PAcMA is included in the first block 21, the concentration of a metallic element introduced to a first region R1 in a contact process described below easily becomes high.

On the other hand, the second block 22 includes, for example, a second main chain 27 and multiple second side chains 28 (e.g., side chains 28A, 28B, 28C, 28D, etc.). For example, the multiple second side chains 28 do not include multiple carbonyl groups. For example, at least one of the multiple second side chains 28 does not include a carbonyl group. The number of carbonyl groups included in at least one of the multiple second side chains 28 may be 1. At least one of the multiple second side chains 28 may include, for example, at least one selected from the group consisting of benzene, naphthalene, and methyl. For example, the second block 22 may include the second main chain 27 and may not include a side chain (e.g., the side chains 28A, 28B, 28C, 28D, etc.). The second main chain 27 may include, for example, at least one selected from the group consisting of a double bond and an ether bond. The second block 22 includes, for example, at least one selected from the group consisting of PS (polystyrene), PVN (polyvinyl naphthalene), polyisoprene, and polyethylene glycol.

The surface energies of the first block 21 and the second block 22 are different from each other. Therefore, by providing a layer of the block copolymer 20 including these blocks on an appropriate neutralizing layer, phase separation of these blocks occurs by for example, directed self-assembly. For example, lamellae that include the first block 21 and lamellae that include the second block 22 are arranged perpendicularly on the neutralizing layer. The surface energy of the appropriate neutralizing layer is between the surface energies of these blocks.

An example of a pattern formation method using such a pattern formation material will now be described. A graphoepitaxy guide is used in the following pattern formation method. A chemoepitaxy guide may be used in the embodiment.

FIG. 2A to FIG. 2F are schematic cross-sectional views illustrating the pattern formation method according to the first embodiment.

Figure 2A:
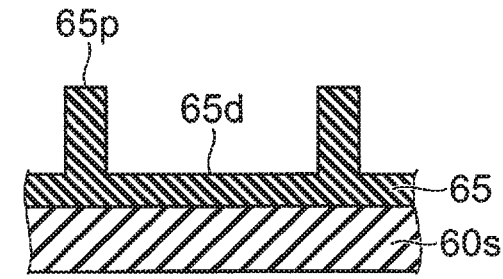
FIG. 2A to FIG. 2F are schematic cross-sectional views illustrating the pattern formation method according to the first embodiment.

As shown in FIG. 2A, a structure body 65 is formed on a substrate 60s. The structure body 65 functions as a graphoepitaxy guide. The structure body 65 includes a projection 65p and a recess 65d. The structure body 65 includes, for example, a thermocurable resin or a photocurable resin. For example, the structure body 65 can be formed by photolithography and etching. For example, the structure body 65 also can be formed by imprinting.

Figure 2B:
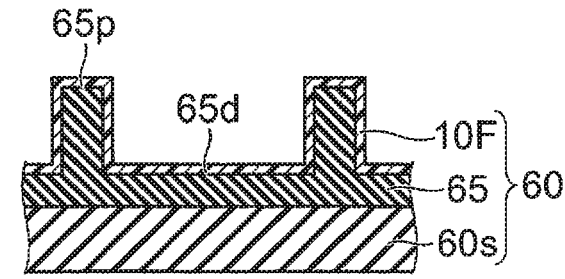

As shown in FIG. 2B, a first layer 10F is formed on the structure body 65. The first layer 10F is provided on the surface (the top surface and the side surface) of the projection 65p and on the surface of the recess 65d. For example, the first layer 10F covers these surfaces. The surface energy of the first layer 10F is larger than the surface energy of the second block 22 (e.g., PS) and smaller than the surface energy of the first block 21 (e.g., PAcMA). For example, the first layer 10F functions as a neutralization film.

In the embodiment, the first layer 10F is provided as necessary. For example, the first layer 10F may be omitted in the case where the surface energy of the structure body 65 is appropriate. A first member 60 includes, for example, the structure body 65. The first member 60 may include, for example, the substrate 60s. The first member 60 may include the first layer 10F.

For example, the first member 60 spreads along the X-Y plane. A direction perpendicular to the X-Y plane is taken as a Z-axis direction. The position in the Z-axis direction of the top portion of the projection 65p is different from the position in the Z-axis direction of the recess 65d.

Figure 2C:
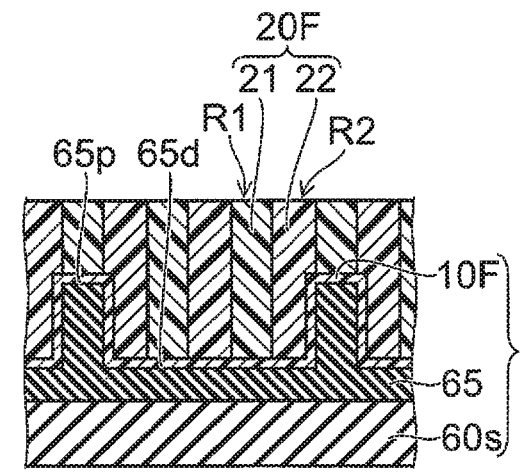

As shown in FIG. 2C, a block copolymer layer 20F is formed on the first member 60. The block copolymer layer 20F includes the block copolymer 20 (the first block 21 recited above and the second block 22 recited above).

For example, phase separation of the first block 21 and the second block 22 is caused by heat treatment, etc. Thereby, a first region R1 that includes the first block 21 and a second region R2 that includes the second block 22 are formed. The first region R1 and the second region R2 each are oriented perpendicularly to the major surface of the first member 60. For example, the direction from the first region R1 toward the second region R2 is along the first member 60. The direction from the first region R1 toward the second region R2 is aligned with the X-Y plane. Thus, a block copolymer layer formation process is performed.

In the example, the first region R1 is positioned on the projection 65p. A set of one first region R1 and one second region R2 is arranged between two projections 65p. The pitch of the set of the one first region R1 and the one second region R2 is smaller than the pitch of the projections 65p.

Figure 2D:
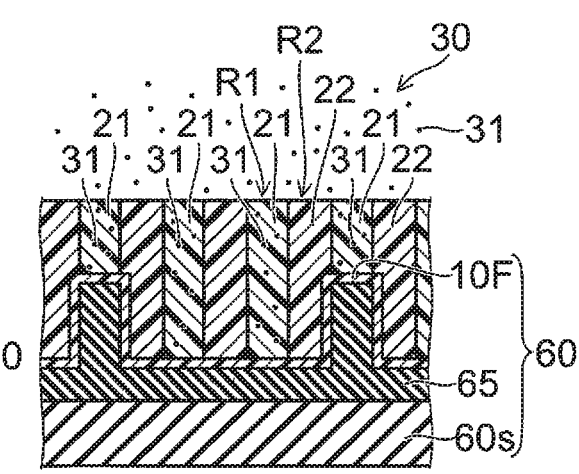

As shown in FIG. 2D, the block copolymer layer 20F is caused to contact a metal compound 30 including a metallic element 31. Thus, a contact process is performed.

The metal compound 30 may include, for example, a metal complex including the metallic element 31. The metallic element 31 may include, for example, at least one selected from the group consisting of aluminum, zinc, titanium, and tungsten. The metal compound 30 may include, for example, trimethyl aluminum (TMA).

The contact process includes, for example, causing the block copolymer layer 20F to contact at least one of a liquid including the metal compound 30 or a gas including the metal compound 30. Thereby, the metal compound 30 is introduced to at least a portion of the block copolymer layer 20F. For example, at least a portion of the block copolymer layer 20F is metallized. For example, the metal compound 30 is diffused in the first region R1. At this time, the metal compound 30 may be diffused in the second region R2.

The structure of the first block 21 of the first region R1 is different from that of the second block 22 of the second region R2. For example, the polarity of the first region R1 is higher than the polarity of the second region R2. For example, the concentration of the metal compound 30 introduced to the first region R1 may be higher than the concentration of the metal compound 30 introduced to the second region R2. The contact process includes, for example, introducing the metal compound 30 to the first region R1.

As described above, the first block 21 of the first region R1 includes the multiple first side chains 26. At least one of the multiple first side chains 26 (e.g., the side chain 26A) includes multiple carbonyl groups. As described below, the metallic element 31 that is included in the metal compound 30 is easily adsorbed to a carbonyl group. The first side chain 26 of the first block 21 includes multiple carbonyl groups. Therefore, the concentration of the metallic element 31 easily becomes high compared to that of polymethyl methacrylate (PMMA) or the like of which the number of carbonyl groups included in the side chain is 1.

On the other hand, the concentration of the metallic element 31 is low in the second region R2 including the second block 22 that does not include a carbonyl group.

After the contact process, the concentration of the metallic element 31 in the second region R2 is lower than the concentration of the metallic element 31 in the first region R1.

Figure 2E:
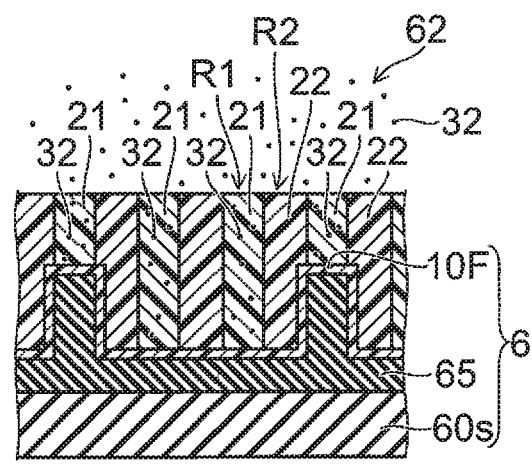

After the contact process recited above as shown in FIG. 2E, treatment of the block copolymer layer 20F in an atmosphere 62 including at least one selected from the group consisting of water, oxygen including a plasma state, and ozone is performed. The treatment process is, for example, an oxidation process.

Thereby, after the processing process, the first region R1 includes an oxide 32 including the metallic element 31. On the other hand, the oxide 32 that includes the metallic element 31 is substantially not formed in the second region R2.

The oxide 32 that includes the metallic element 31 includes, for example, at least one selected from the group consisting of aluminum oxide, zinc oxide, titanium oxide, and tungsten oxide.

Due to such an oxide 32, the etching resistance of the first region R1 is higher than the etching resistance of the second region R2. The etching rate of the first region R1 is lower than the etching rate of the second region R2.

Figure 2F:
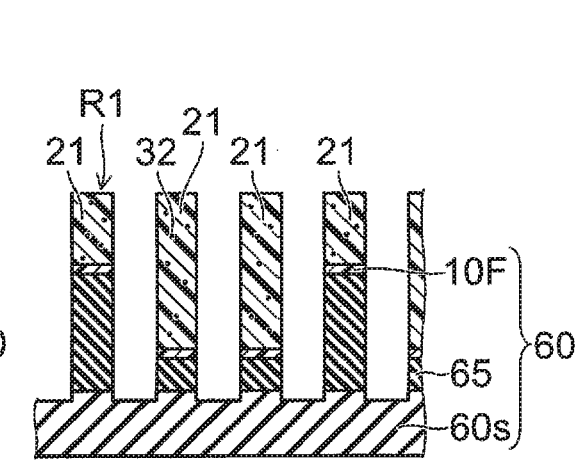

After the processing process recited above as shown in FIG. 2F, the second region R2 is removed. As described above, the etching rate of the first region R1 is lower than the etching rate of the second region R2. Therefore, the first region R1 remains.

Further, at least a portion of the portion of the first member 60 not overlapping the first region R1 is removed. As described below, by using an appropriate material as the first layer 10F, the concentration of the metallic element 31 (or the oxide 32) included in the first layer 10F can be low. The removal of the portion of the first layer 10F not overlapping the first region R1 is easy.

The removal (a first removal) of the second region R2 may be performed continuously with the removal (a second removal) of the at least a portion of the portion of the first member 60 not overlapping the first region R1. These removals are performed by, for example, RIE (Reactive Ion Etching), etc. The etching conditions of the first removal may be different from the etching conditions of the second removal.

In the embodiment, the oxide 32 substantially is not formed in the second region R2 that substantially does not include a carbonyl group. A high etching rate can be maintained in the second region R2. On the other hand, a low etching rate is obtained in the first region R1 including the carbonyl groups. Therefore, the selectivity (the difference of the etching rates, e.g., the etching contrast) between the first region R1 and the second region R2 can be large. According to the embodiment, a pattern formation method in which the pattern precision can be increased.

In the contact process recited above, the metal compound 30 that includes the metallic element 31 contacts the block copolymer layer 20F. It was found that the metal compound 30 adsorbs (which may include bonding) to the carbonyl groups at this time. For example, from calculations using a quantum chemical calculation program (Gaussian, etc.), it was found that the metallic element 31 (e.g., Al) of the metal compound 30 is adsorbed (bonded) to a carbonyl group more easily than to a hydrocarbon or an ether group. In the case where the concentration of the carbonyl group included in the polymer is high, the concentration of the metallic element 31 of the metal compound 30 adsorbed to the polymer is high.

After the contact process in the embodiment, for example, the metallic element 31 is adsorbed (which may include bonding) to the carbonyl groups.

The metallic element 31 (e.g., Al) of the metal compound 30 exists at a high concentration in the first region. R1 including the carbonyl groups. In the embodiment, at least one of the first side chain 26 of the first block 21 includes multiple carbonyl groups. Therefore, the concentration of the metallic element 31 in the first region R1 is high compared to the case of PMMA or the like of which the number of carbonyl groups included in the side chain is 1.

On the other hand, the concentration of the metallic element 31 in the second region R2 is low. Thereby, the etching can be performed effectively using the first region R1 as a mask.

An example of experimental results relating to the etching resistance of the polymer film after the processing process recited above (e.g., the oxidation process) will now be described.

In the experiment, a film of a material including a polymer including a carbonyl group is formed on a silicon substrate. A first sample includes PAcMA. A second sample includes PMMA. In the experiment, instead of a block copolymer, the first block 21 is provided and the second block 22 is not provided. After the formation of the film of these samples, treatment with TMA (a contact process for the metal compound 30 including the metallic element 31) and treatment (a processing process, e.g., an oxidation process) in the atmosphere 62 including water are performed. Subsequently, RIE processing (etching) using a gas including oxygen plasma is performed. The film after the etching is observed by a scanning electron microscope (SEM).

Figure 3A:
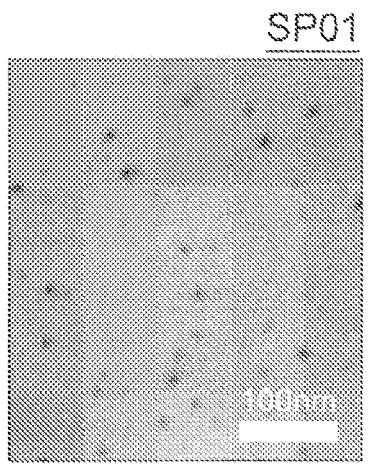
FIG. 3A and FIG. 3B are microscope photographs illustrating the experimental results.
Figure 3B:
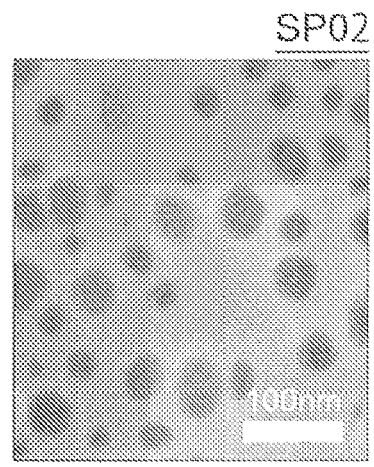

FIG. 3A and FIG. 3B are microscope photographs illustrating the experimental results.

FIG. 3A corresponds to the first sample SP01 (PAcMA). FIG. 3B corresponds to the second sample SP02 (PMMA).

As shown in FIG. 3B, large holes (the dark regions inside the photograph) are observed for the film after the etching of the second sample SP02. Conversely, for the first sample SP01 as shown in FIG. 3A, holes are substantially not observed (or the sizes of the holes are small).

It can be seen from FIG. 3A and FIG. 3B that the etching resistance improves when the side chain of the polymer includes the multiple carbonyl groups. It is considered that the improvement of the etching resistance has a relationship with the concentration of the metallic element 31 (the concentration of the oxide 32) becoming high due to the side chain of the polymer including the multiple carbonyl groups.

In the embodiment, examples of the first side chain 26 (e.g., the side chain 26A) including the multiple carbonyl groups can be represented by, for example, the following first to third chemical formulas.

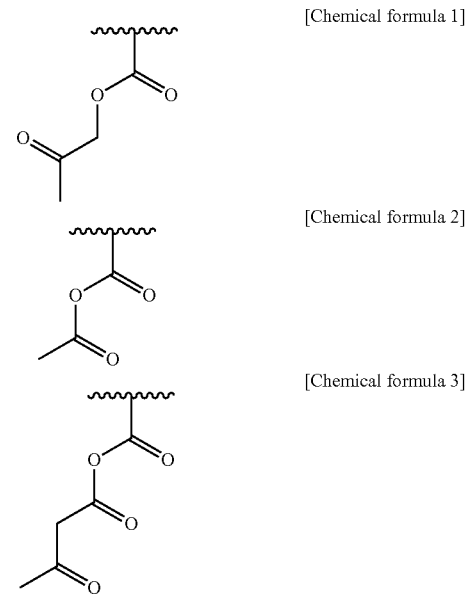

[Chemical formula 1]

[Chemical formula 2]

[Chemical formula 3]

In the embodiment, examples of the first block 21 can be represented by, for example, the following fourth to sixth chemical formulas.

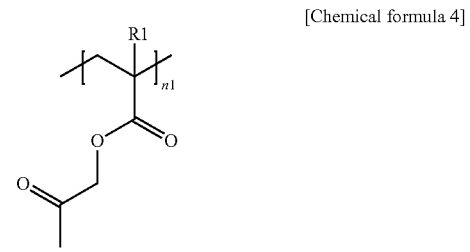

[Chemical formula 4]

[Chemical formula 5]

[Chemical formula 6]

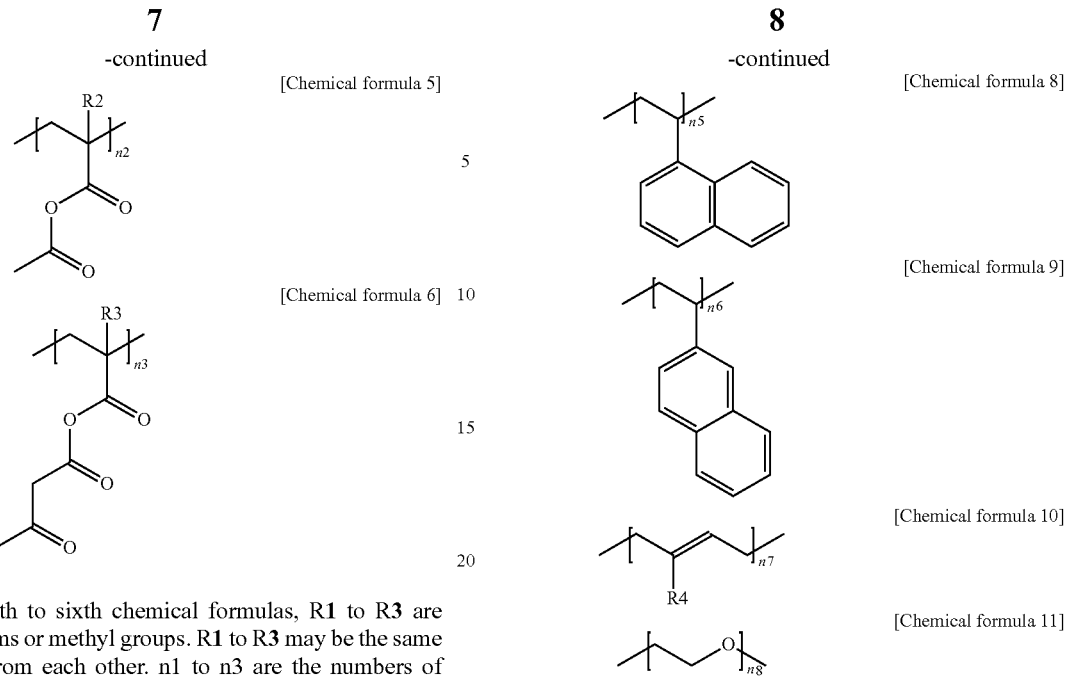

[Chemical formula 8]

[Chemical formula 9]

[Chemical formula 10]

[Chemical formula 11]

In the fourth to sixth chemical formulas, R1 to R3 are hydrogen atoms or methyl groups. R1 to R3 may be the same or different from each other. n1 to n3 are the numbers of repetitions and may be the same or different from each other. For example, n1 to n3 are not less than 50 and not more than 10,000.

In the embodiment, the first block 21 includes, for example, at least one selected from the group consisting of an acrylic acid ester structure and a methacrylic acid ester structure. The first block 21 is made of, for example, a repetition of a monomer including at least one selected from the group consisting of an acrylic acid ester structure and a methacrylic acid ester structure.

The first block 21 includes, for example, at least one selected from the group consisting of acetonyl acrylic acid ester and acetonyl methacrylic acid ester. The first block 21 includes, for example, at least one selected from the group consisting of a polymer of acetonyl acrylic acid ester and a polymer of acetonyl methacrylic acid ester. The first block 21 includes, for example, at least one selected from the group consisting of polyacetonyl acrylic acid ester (PAcAA) and polyacetonyl methacrylic acid ester (PAcMA). For example, PAcAA and PAcMA can be synthesized relatively easily.

The ratio (C2/C1) of a concentration C2 of the carbonyl group included in the second block 22 to a concentration C1 of the carbonyl group included in the first block 21 may be, for example, not less than 0 and not more than 0.5. C2/C1 may be, for example, not less than 0 and not more than 0.1. C2/C1 may be, for example, not less than 0 and not more than 0.01. C2/C1 may be, for example, not less than 0 and not more than 0.001.

In the embodiment, examples of the second block 22 can be represented by, for example, the following seventh to eleventh chemical formulas.

[Chemical formula 7]

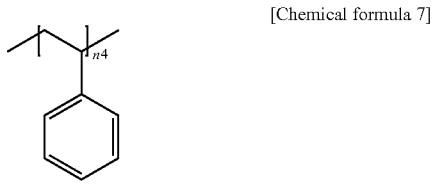

In the seventh to eleventh chemical formulas, R4 is a hydrogen atom or a methyl group. n4 to n8 are the numbers of repetitions and may be the same or different from each other. For example, n4 to n8 are not less than 50 and not more than 10,000.

As described above, the pattern formation material 120 according to the embodiment may include a solvent. The solvent includes, for example, at least one selected from the group consisting of propylene glycol monomethyl ether acetate (PGMEA), propylene glycol monomethyl ether (PGME), anisole, toluene, ethyl lactate, and tetrahydrofuran (THF).

The concentration of the block copolymer 20 of the pattern formation material 120 is, for example, not less than 0.01 weight % and not more than 50 weight %.

By setting the solvent and the concentration appropriately, a uniform film that includes the pattern formation material can be formed easily.

An example of the first layer 10F will now be described.

In the embodiment, for example, the material (a first layer formation material) of the first layer 10F substantially does not include a carbonyl group. Therefore, the concentration of the metallic element 31 in the first layer 10F is low.

For example, the material (the first layer formation material) of the first layer 10F includes, for example, a polymer including a first monomer including carbon, hydrogen, and a first group. The first group includes, for example, at least one of a vinyl group, a hydroxy group, and a first element. The first element includes at least one selected from the group consisting of fluorine, chlorine, and bromine. The first group includes, for example, at least one selected from the group consisting of vinyl alcohol, hydroxystyrene, and vinyl chloride.

For example, after the contact process (the contact with the metal compound 30), the concentration of the metallic element 31 in the first layer 10F is lower than the concentration of the metallic element 31 in the first region R1. After the oxidation process (e.g., the processing in the atmosphere 62 including at least one selected from the group consisting of water, oxygen including a plasma state, and ozone), the oxide 32 that includes the metallic element 31 is substantially not formed in the first layer 10F. The etching rate of the first region R1 is lower than the etching rate of the first layer 10F.

In the process shown in FIG. 2F, the portion of the first layer 10F not overlapping the first region R1 is removed easily. The etching rate of the first region R1 is lower than the etching rate of the first layer 10F. For example, the oxide 32 is not formed in the first layer 10F. Therefore, a high etching rate can be maintained for the first layer 10F. The selectivity between the first region R1 and the first layer 10F can be large. A pattern formation method in which the pattern precision can be increased.

For example, the surface energy of the polymer included in the first layer formation material of the first layer 10F is between the surface energies of the multiple blocks included in the block copolymer.

Examples of the polymer included in the first layer formation material can be represented by, for example, the following twelfth to sixteenth chemical formulas.

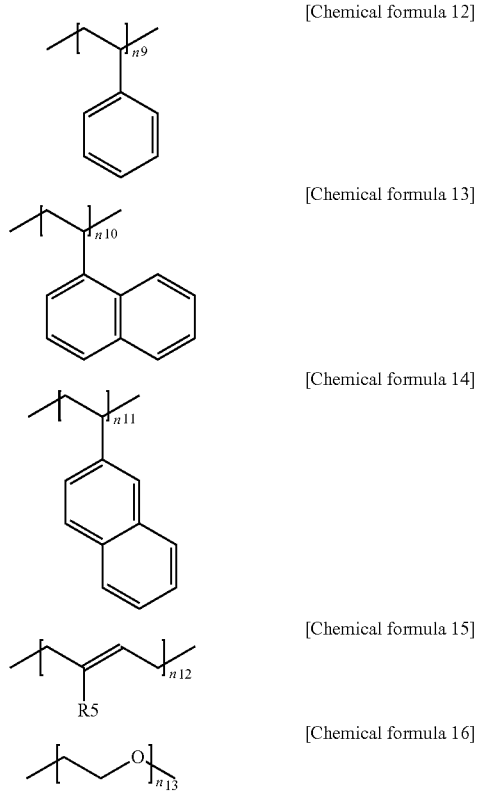

[Chemical formula 12]

[Chemical formula 13]

[Chemical formula 14]

[Chemical formula 15]

[Chemical formula 16]

In the twelfth to sixteenth chemical formulas, R5 is a hydrogen atom or a methyl group. n9 to n13 are the numbers of repetitions and may be the same or different from each other. For example, n9 to n13 are not less than 10 and not more than 10,000.

The polymer that is included in the first layer formation material does not include a carbonyl group. Or, in the case where the polymer that is included in the first layer formation material includes a carbonyl group, the concentration of the carbonyl group of the polymer included in the first layer formation material is, for example, 0.0005 mol/g or less. The concentration of the carbonyl group of the polymer included in the first layer formation material may be 0.00005 mol/g or less. The concentration of the carbonyl group of the polymer included in the first layer formation material may be 0.000005 mol/g or less. For example, the concentration of the metallic element 31 in the first layer 10F after the contact process can be low.

In the process illustrated in FIG. 2B (the formation of the first layer 10F), for example, a solution of the first layer formation material is coated onto the surface of the projection 65p. The method for coating includes, for example, any method such as inkjet, dip coating, bar coating, spin coating, etc. Heat treatment is performed as necessary. Thereby, the first layer 10F is formed.

Second Embodiment

The second embodiment relates to a block copolymer. The block copolymer 20 (referring to FIG. 1) includes the first block 21 and the second block 22. The block copolymer 20 is, for example, a diblock copolymer. The number of types of blocks included in the block copolymer 20 may be three or more. The first block 21 is different from the second block 22. The first block 21 includes, for example, a carbonyl group. On the other hand, in one example, for example, the second block 22 does not include a carbonyl group.

The first block 21 includes the first main chain 25 and the multiple first side chains 26 (e.g., the side chains 26A, 26B, 26C, 26D, etc.).

At least one of the multiple first side chains 26 of the first block 21 (e.g., the side chain 26A) includes multiple carbonyl groups. The number of carbon atoms included in the at least one of the multiple first side chains 26 (e.g., the side chain 26A) is not less than 3 but less than 7. The number of oxygen atoms included in the at least one of the multiple first side chains 26 (e.g., the side chain 26A) is not less than 2 but less than 5. The terminal of the at least one of the multiple first side chains 26 (e.g., the side chain 26A) is a hydrocarbon. In the at least one of the multiple first side chains 26 (e.g., the side chain 26A), the furthest carbon atom from the first main chain 25 is bonded to hydrogen atoms.

Because at least one of the multiple first side chains 26 includes the multiple carbonyl groups, for example, the concentration of the metallic element 31 can be set high after the contact process recited above. A block copolymer and a pattern formation material can be provided in which the pattern precision is increased.

In the case where the number of carbon atoms is 7 or more, for example, the storage stability of the block copolymer becomes low. It is considered that the glass transition temperature of the phase formed by the first block 21 is below room temperature in the case where the number of carbon atoms included in at least one of the multiple first side chains 26 of the first block 21 (e.g., the side chain 26A) is 7 or more. As a result, the phase is constantly in an environment that is above the glass transition temperature; and side reactions such as crosslinking, etc., occur easily inside the phase. Because the multiple carbonyl groups are included in the side chain 26A, the minimum value of the number of carbon atoms included in the side chain 26A is 2.

In the case where the number of oxygen atoms is 5 or more, for example, the storage stability of the block copolymer becomes low. It is considered that the glass transition temperature of the phase formed by the first block 21 is below room temperature in the case where the number of oxygen atoms included in at least one of the multiple first side chains 26 of the first block 21 (e.g., the side chain 26A) is 5 or more. As a result, the phase is constantly in an environment that is above the glass transition temperature; and side reactions such as crosslinking, etc., occur easily inside the phase. Because the multiple carbonyl groups are included in the side chain 26A, the minimum value of the number of oxygen atoms included in the side chain 26A is 2.

High stability is obtained when the terminal is a hydrocarbon. For example, in the case where the terminal is a carboxy group, for example, the polarity may increase and may become insoluble to the desired solvent.

The first block 21 includes, for example, at least one selected from the group consisting of an acrylic acid ester structure and a methacrylic acid ester structure. The first block 21 is made of, for example, a polymer of a monomer including at least one selected from the group consisting of an acrylic acid ester structure and a methacrylic acid ester structure.

The first block 21 includes, for example, at least one selected from the group consisting of acetonyl acrylic acid ester and acetonyl methacrylic acid ester. The first block 21 includes, for example, at least one selected from the group consisting of a polymer of acetonyl acrylic acid ester and a polymer of acetonyl methacrylic acid ester. The first block 21 includes, for example, at least one selected from the group consisting of PAcAA and PAcMA.

For example, PAcAA and PAcMA can be synthesized relatively easily. The density of the carbonyl group with respect to the molecular weight is high for PAcAA and PAcMA.

The second block 22 includes, for example, the second main chain 27 and the multiple second side chains 28 (e.g., the side chains 28A, 28B, 28C, 28D, etc.). For example, the multiple second side chains 28 do not include multiple carbonyl groups. For example, at least one of the multiple second side chains 28 does not include a carbonyl group. The number of carbonyl groups included in at least one of the multiple second side chains 28 may be 1. At least one of the multiple second side chains may include, for example, at least one selected from the group consisting of benzene, naphthalene, and methyl. For example, the second block 22 may include the second main chain 27 and may not include a side chain (e.g., the side chains 28A, 28B, 28C, 28D, etc.). The second main chain 27 may include, for example, at least one selected from the group consisting of a double bond and an ether bond. The second block 22 includes, for example, at least one selected from the group consisting of PS (polystyrene), PVN (polyvinyl naphthalene), polyisoprene, and polyethylene glycol.

The ratio (C2/C1) of the concentration C2 of the carbonyl group included in the second block 22 to the concentration C1 of the carbonyl group included in the first block 21 is, for example, not less than 0 and not more than 0.5. For example, C2/C1 may be not less than 0 and not more than 0.1. For example, C2/C1 may be not less than 0 and not more than 0.01. For example, C2/C1 may be not less than 0 and not more than 0.001.

For example, the block copolymer according to the embodiment is manufactured by the following method.

Copper bromide, acetonyl acrylate (AcAA), and N-propyl-2-pyridylmethanimine are added to toluene in a flask; the reaction vessel is deoxidized and is heated to 90° C. After the heating, 2-ethyl bromoisobutyrate is added to start the polymerization. The entire reaction is performed in a nitrogen atmosphere. After 24 hours, styrene is added to the reaction solution; and the reaction is performed for another 24 hours. After the reaction, the flask is opened to air and slowly cooled. The toluene is removed in vacuo; and the concentrated liquid is reprecipitated into a large excess of methanol. A solid is filtered off; and the desired diblock copolymer is obtained.

For example, polyacetonyl acrylate (PAcAA), which is acetonyl acrylic acid ester polymerized as a homopolymer and is used to form the material of the first block, is a viscous body in a rubber state at room temperature; and the handling properties of the PAcAA homopolymer are poor. Conversely, the block copolymer obtained by combining PAcAA with the second block (e.g., PS) is a powder. The handling properties of this block copolymer are good. Thus, the handling properties of the polymer can be improved by using a block copolymer.

Third Embodiment

A third embodiment relates to a pattern formation material. The pattern formation material includes the block copolymer 20 (referring to FIG. 1) and a solvent.

The solvent includes, for example, at least one selected from the group consisting of propylene glycol monomethyl ether acetate (PGMEA), propylene glycol monomethyl ether (PGME), anisole, toluene, ethyl lactate, and tetrahydrofuran (THF).

The concentration of the block copolymer 20 of the pattern formation material is, for example, not less than 0.01 weight % and not more than 50 weight %.

By setting the solvent and the concentration appropriately, a uniform film that includes the pattern formation material can be formed easily.

The embodiments include, for example, the following configurations (e.g., technological proposals).

Configuration 1

A pattern formation method, comprising:

a preparation process of preparing a pattern formation material including a block copolymer including a first block and a second block, the first block including a first main chain and multiple first side chains, at least one of the multiple first side chains including multiple carbonyl groups;

a block copolymer layer formation process of forming a block copolymer layer on a first member, the block copolymer layer including the pattern formation material and including a first region and a second region, the first region including the first block, the second region including the second block; and a contact process of causing the block copolymer layer to contact a metal compound including a metallic element.

Configuration 2

The pattern formation method according to Configuration 1, wherein the block copolymer layer formation process includes phase separation of the first block and the second block.

Configuration 3

The pattern formation method according to Configuration 1 or 2, wherein a direction from the first region toward the second region is along the first member.

Configuration 4

The pattern formation method according to any one of Configurations 1 to 3, wherein the first block includes at least one selected from the group consisting of an acrylic acid ester structure and a methacrylic acid ester structure.

Configuration 5

The pattern formation method according to any one of Configurations 1 to 3, wherein the first block includes at least one selected from the group consisting of acetonyl acrylic acid ester and acetonyl methacrylic acid ester.

Configuration 6

The pattern formation method according to any one of Configurations 1 to 5, wherein the second block includes a second main chain and multiple second side chains, the multiple second side chains not including multiple carbonyl groups.

Configuration 7

The pattern formation method according to any one of Configurations 1 to 5, wherein the second block includes a second main chain and multiple second side chains, and at least one of the multiple second side chains includes at least one selected from the group consisting of benzene, naphthalene, and methyl.

Configuration 8

The pattern formation method according to any one of Configurations 1 to 5, wherein the second block includes a second main chain, and the second main chain includes at least one selected from the group consisting of a double bond and an ether bond.

Configuration 9

The pattern formation method according to any one of Configurations 1 to 8, wherein the second block does not include a carbonyl group, or the second block includes a carbonyl group, and a ratio of a concentration of the carbonyl group included in the second block to a concentration of the carbonyl group included in the first block is 0.5 or less.

Configuration 10

The pattern formation method according to any one of Configurations 1 to 9, wherein the contact process includes causing the block copolymer layer to contact at least one of a liquid including the metal compound and a gas including the metal compound.

Configuration 11

The pattern formation method according to any one of Configurations 1 to 10, wherein the metallic element includes at least one selected from the group consisting of aluminum, zinc, titanium, and tungsten.

Configuration 12

The pattern formation method according to any one of Configurations 1 to 11, including removing at least a portion of the second region and removing at least a portion of the first member after the contact process, the at least a portion of the first member not overlapping the first region.

Configuration 13

A block copolymer, comprising:

a first block; and a second block, the first block including a first main chain and multiple first side chains, at least one of the multiple first side chains including multiple carbonyl groups, a number of carbon atoms included in the at least one of the multiple first side chains being not less than 3 but less than 7, a number of oxygen atoms included in the at least one of the multiple first side chains being not less than 2 but less than 5, a terminal of the at least one of the multiple first side chains being a hydrocarbon.

Configuration 14

The block copolymer according to Configuration 13, wherein the first block includes at least one selected from the group consisting of an acrylic acid ester structure and a methacrylic acid ester structure.

Configuration 15

The block copolymer according to Configuration 13, wherein the first block includes at least one selected from the group consisting of acetonyl acrylic acid ester and acetonyl methacrylic acid ester.

Configuration 16

The block copolymer according to any one of Configurations 13 to 15, wherein the second block includes a second main chain and multiple second side chains, and the multiple second side chains do not include multiple carbonyl groups.

Configuration 17

The block copolymer according to any one of Configurations 13 to 15, wherein the second block includes a second main chain and multiple second side chains, and at least one of the multiple second side chains includes at least one selected from the group consisting of benzene, naphthalene, and methyl.

Configuration 18

The block copolymer according to any one of Configurations 13 to 15, wherein the second block includes a second main chain, and the second main chain includes at least one selected from the group consisting of a double bond and an ether bond.

Configuration 19

The block copolymer according to any one of Configurations 13 to 18, wherein the second block does not include a carbonyl group, or the second block includes a carbonyl group, and a ratio of a concentration of the carbonyl group included in the second block to a concentration of the carbonyl group included in the first block is 0.5 or less.

Configuration 20

A pattern formation material, comprising:

the block copolymer according to any one of Configurations 13 to 19; and a solvent.

Configuration 21

The pattern formation material according to Configuration 20, wherein the solvent includes at least one selected from the group consisting of propylene glycol monomethyl ether acetate, propylene glycol monomethyl ether, anisole, toluene, ethyl lactate, and tetrahydrofuran.

Configuration 22

The pattern formation material according to Configuration 20 or 21, wherein a concentration of the block copolymer of the pattern formation material is not less than 0.01 weight % and not more than 50 weight %.

According to the embodiments, a pattern formation method, a block copolymer, and a pattern formation material can be provided in which the pattern precision can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of components used in pattern formation method and pattern formation material such as polymers, monomers, block copolymers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all pattern formation methods, pattern formation materials practicable by an appropriate design modification by one skilled in the art based on the pattern formation methods, the pattern formation materials described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method, comprising:
   preparing a pattern formation material including a block copolymer having a first block and a second block, the first block including a first main chain and a plurality of first side chains, at least one of the first side chains including a plurality of carbonyl groups;
   forming a block copolymer layer including the pattern formation material on a first member, the block copolymer layer including a first region and a second region, the first region including the first block, the second region including the second block; and
   contact a metal compound including a metallic element to the block copolymer layer,
   wherein the first block includes at least one selected from the group consisting of an acetonyl acrylic acid ester and acetonyl methacrylic acid ester.

2. The method according to claim 1, wherein forming the block copolymer layer includes phase separation of the first block and the second block.

3. The method according to claim 1, wherein a direction from the first region toward the second region is along the first member.

4. The method according to claim 1, wherein the second block includes a second main chain and a plurality of second side chains, at least one of the second side chain not including a plurality of carbonyl groups.

5. The method according to claim 1, wherein
   the second block includes a second main chain and a plurality of second side chains, and
   at least one of the second side chains includes at least one selected from the group consisting of benzene, naphthalene, and methyl.

6. The method according to claim 1, wherein
   the second block includes a second main chain, and
   the second main chain includes at least one selected from the group consisting of a double bond and an ether bond.

7. The method according to claim 1, wherein
   the second block does not include a carbonyl group, or
   the second block includes a carbonyl group, and a ratio of a concentration of the carbonyl group included in the second block to a concentration of the carbonyl group included in the first block is 0.5 or less.

8. The method according to claim 1, wherein the metal compound is in a liquid state or a gas state.

9. The method according to claim 1, wherein the metallic element includes at least one selected from the group consisting of aluminum, zinc, titanium, and tungsten.

10. The method according to claim 1, further comprising, removing at least a portion of the second region and removing at least a portion of the first member after contacting a metal compound including a metallic element to the block copolymer layer, the at least a portion of the first member not overlapping the first region.

11. The method according to claim 1, wherein the pattern formation material further includes a solvent.

12. The method according to claim 11, wherein the solvent includes at least one selected from the group consisting of propylene glycol monomethyl ether acetate, propylene glycol monomethyl ether, anisole, toluene, ethyl lactate, and tetrahydrofuran.

13. The method according to claim 1, wherein the concentration of the block copolymer of the pattern formation material is not less than 0.01 weight % and not more than 50 weight %.

14. The method according to claim 1, wherein the metal compound is introduced in the first region.

* * * * *